(12) United States Patent
Mimken et al.

(10) Patent No.: US 6,286,688 B1
(45) Date of Patent: *Sep. 11, 2001

(54) COMPLIANT SILICON WAFER HANDLING SYSTEM

(75) Inventors: Victor B. Mimken; Tom Krawzak, both of Boise, ID (US)

(73) Assignee: SCP Global Technologies, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/825,883

(22) Filed: Apr. 2, 1997

Related U.S. Application Data

(60) Provisional application No. 60/014,784, filed on Apr. 3, 1996.

(51) Int. Cl.$^7$ .................................................. B65G 49/07

(52) U.S. Cl. ....................... 211/41.18; 414/937; 414/404; 206/454

(58) Field of Search ...................... 211/41.18, 41.1; 206/454, 710–711, 832–833; 414/404, 416, 940–941, 935, 936–938, 800

(56) References Cited

U.S. PATENT DOCUMENTS

| Re. 33,361 | * | 10/1990 | Coe ........................ 206/454 |
| 3,949,891 | * | 4/1976 | Butler et al. ................ 211/41.18 |
| 4,427,332 | * | 1/1984 | Manriquez ................ 211/41.18 X |
| 4,450,960 | * | 5/1984 | Johnson et al. ............ 206/454 X |
| 4,529,353 | * | 7/1985 | Dean et al. ................ 414/404 |
| 4,568,234 | * | 2/1986 | Lee et al. .................. 414/404 |
| 4,609,103 | * | 9/1986 | Bimer et al. .............. 211/41.18 |
| 4,611,966 | * | 9/1986 | Johnson .................... 414/104 |
| 4,779,732 | * | 10/1988 | Boehm et al. ............. 206/454 |
| 4,804,086 | * | 2/1989 | Grohrock .................. 211/41.18 |
| 4,840,530 | * | 6/1989 | Nguyen .................... 206/454 X |
| 4,986,729 | * | 1/1991 | Ohlenbusch ............... 414/404 |
| 4,987,407 | | 1/1991 | Lee .......................... 340/540 |
| 4,993,559 | * | 2/1991 | Cota ........................ 211/41.18 |
| 5,012,935 | * | 5/1991 | Aigo ........................ 211/41.18 |
| 5,046,615 | * | 9/1991 | Nentl et al. ............... 206/454 |
| 5,217,341 | * | 6/1993 | Webber et al. ............ 211/41.18 |
| 5,228,568 | * | 7/1993 | Ogino et al. .............. 206/334 |
| 5,255,797 | * | 10/1993 | Kos ......................... 206/454 X |

(List continued on next page.)

Primary Examiner—Jerry Redman
Assistant Examiner—Jennifer E. Novosad
(74) Attorney, Agent, or Firm—Stallman & Pollock LLP

(57) ABSTRACT

A compliant wafer comb assembly for use in transferring semiconductor wafers between wafer cassettes, wafer carriers, or other wafer holding devices. The compliant wafer comb includes a plurality of slots in which wafer(s) can be held while being transported. The slots are parallel to each other and downward sloping from one end of the comb to the other. The sloped arrangement causes a single wafer at a time to become engaged with the comb when a batch of wafers is transferred from a cassette or wafer holding device to the comb, allowing the compliant features of the comb to compensate for the misalignment of each wafer individually. The comb is coupled to a static base structure by a set of independent column springs which permit motion of the comb slots in any direction necessary to compensate for a wafer's misalignment. This permits transfer of a misaligned wafer or wafers from a cassette or other carrier to the comb without damaging the wafer(s). The present invention is also directed to a wafer handling system which includes the compliant comb and sensor(s) for monitoring when a wafer is severely enough misaligned that transfer to the comb would damage the wafer. In such a situation, a feedback signal generated by the sensor to an attached controller is used to alter the position of a robotic arm or other mechanism used to align the comb with respect to the wafers, or to halt the motion of the robot.

12 Claims, 5 Drawing Sheets

U.S. PATENT DOCUMENTS

| | | | | |
|---|---|---|---|---|
| 5,273,159 | * | 12/1993 | Gregerson | 206/454 |
| 5,351,836 | * | 10/1994 | Mori et al. | 211/41.18 |
| 5,476,176 | * | 12/1995 | Gregerson et al | 206/711 |
| 5,482,161 | * | 1/1996 | Williams et al. | 206/711 |
| 5,501,568 | * | 3/1996 | Ono | 414/404 |
| 5,563,798 | | 10/1996 | Berken et al. | 364/478.06 |
| 5,573,023 | * | 11/1996 | Thompson et al. | 134/66 |
| 5,706,946 | * | 1/1998 | Kakizaki et al. | 211/41.1 |
| 5,855,280 | * | 1/1999 | Huseman | 211/41.18 |

* cited by examiner

COMPLIANT SILICON WAFER HANDLING SYSTEM

REFERENCE TO RELATED APPLICATION

This patent application is a non-provisional application filed under 35 U.S.C. §111(a) claiming priority under 35 U.S.C. §119(e)(1) based on provisional application no. 60/014,784, filed Apr. 3, 1996.

TECHNICAL FIELD

The present invention is directed to apparatus and systems used to transfer silicon wafers between processing stations during the fabrication of semiconductor devices, and more specifically, to a compliant comb and support structure for holding the wafers. The compliant comb and support structure permits wafers which are misaligned with respect to the comb or another wafer holding device to be transferred from the holding device to the comb or from the comb to the holding device without causing damage to the wafers.

BACKGROUND OF THE INVENTION

The processing of silicon wafers to form semiconductor devices involves a number of processing stages which are performed at different stations. The wafers are typically held in a wafer cassette or other type of wafer holding device during the processing stage. After completion of the processing stage, the wafers are transferred to a wafer comb in which they are transported to the next processing station, where they are transferred from the comb to another wafer cassette or holding device. Automated wafer handling mechanisms such as robots are often used to load the wafers into a comb, transport the comb to a processing station, and unload the wafers from the comb into a wafer cassette, processing rack, or other wafer holding device. The loading of wafers into a comb from a wafer holding device such as a cassette or process rack is accomplished by arranging the comb slots so that the wafers in the cassette engage the slots, and then moving the wafers into the comb. The loading of wafers into a cassette or holding device from a comb is accomplished in a similar manner. Such wafer transfers can consist of batches of variable size, including single wafer transfers.

In order for the wafers to be processed into properly functioning devices, it is necessary that they not be damaged during the wafer transport and (un)loading processes. One source of potential damage to the wafers is misalignment between a wafer in a wafer cassette or processing rack and the slots of a wafer comb. If a misalignment exists between the wafer positions(s) and the comb slots, forces large enough to cause chipping, scratching, or breakage of the wafer can be produced. Damage to the transport or loading equipment may also result from improper positioning of a robotic arm carrying a wafer or wafers relative to a slot or slots in a comb, cassette, processing rack, or other wafer holding device. Misalignments are even more likely to cause damage to one or more wafers in the situation in which a comb is used to transfer a batch of wafers to another wafer holding device. This is because not all wafers in a batch will necessarily have the same type or degree of misalignment.

When extracting wafers from a process cassette or other wafer holder by engaging the wafers with the slots of a comb, the resulting forces can lead to frictional binding, causing the entire process cassette or holding device to be lifted with the wafers. Both the wafers and cassette or holding device can be damaged in such an event. Other undesirable effects of misalignment include damage to the robotics and loss of mechanism calibration. In addition to wafer or equipment damage, wafer cross-slotting (wafers having one side placed in a slot which doesn't correspond to the slot in which the other side is placed) or misplacement into an incorrect cassette slot are common problems caused by misalignment of wafer positions relative to a cassette or wafer holder.

The potential sources of wafer misalignment go beyond variations in the dimensions of wafers and wafer handling tool parts, assembly tolerances, and robotic "learn" points. There are also dynamic errors which add to the misalignment problem. High process temperatures can lead to thermal expansion of process cassettes (especially those made of plastic resins), producing an additional source of misalignment between a wafer handling tool, a wafer, and the slots in a comb or cassette. Wafer cassettes are also prone to warping over time due to swelling, fatigue, and creep. In addition, human errors during manual operation of robots can lead to collisions between wafer handling tools and cause misalignments. These sources produce misalignment problems which may be imperceptible to the human eye, but can be significant in the wafer transfer process.

Current robotic technology utilizes precise control of position and motion to permit interaction between robot mechanisms and a wafer comb, cassette, or processing rack. This precision can be difficult to attain if what is being positioned with the robot is delicate, yet like wafers, not consistent in size from one unit to the next. The dimensional variability of the wafers, separately or in addition to wafer handling tool control limitations, can produce misalignment of the wafers in the cassette slots or processing rack with respect to a wafer comb or other transfer device.

One method of reducing some of these sources of misalignment is to attempt to guarantee extremely precise robotic movements through parts tolerancing, use of alignment fixtures and measurement devices during setup, and other quality control measures to screen out "bad" parts. However, this approach leads to unnecessarily high material and labor costs. In addition, the risk of frictional binding between a wafer and a cassette is not greatly reduced by these measures. As noted, frictional binding results from misalignments which cause cassette lifting during wafer extraction, especially when a high Coulomb friction coefficient exists (e.g. quartz cassette and silicon wafer). This problem is exacerbated during the batch transfer of wafers from a cassette or other holding device to a comb where binding of one wafer in a slot during engagement with the comb is all that is required to potentially damage the entire batch.

The sources of misalignment can also be compensated for in a number of different ways. One way is to use a multitude of sensors to detect the position of the wafer(s) and then control the motion of the robotics to compensate for any misalignment. This is done by adjusting the position of the robotic arm which moves the wafer(s) or comb with respect to the cassette, usually by altering the coordinates of the destination position of the wafer. The robotic arm will then transfer the wafer to a corrected destination position which accounts for the misalignment. However, one disadvantage of such systems is that they require a feedback loop between the sensor(s) and the robotic arm and hence can significantly slow down the wafer transport process, since each wafer in a batch may be misaligned in a different manner. Another disadvantage is that when extracting more than one wafer at a time, dynamic (re)positioning of the robot will not compensate for slot-to-slot dimensional variations in the process cassette or wafer holder relative to the comb.

Another method of dealing with the problems caused by wafer misalignments is to have a compliant system for handling the wafers. Such a system is tolerant of a degree of misalignment and compensates for the misalignment(s) by passively adjusting the position(s) of the wafers. A compliant system can cope with misalignments created by dimensional variabilities in the objects being positioned, as well as misalignments of the wafer handling tools.

However, a disadvantage of some existing compliant systems is that motion of the wafer holder or comb which is part of the system along one axis in order to compensate for a misalignment produces motion along a second axis. This prevents independent control of motion in one direction, which may be what is required in order to correctly position the wafers without causing damage. For example, if lateral compliance of the wafer comb or holder to a wafer misalignment is associated with a vertical motion, then a wafer may end up being positioned high enough above a wafer slot to be damaged when it is released from the wafer comb into the slot. Another disadvantage of some compliant systems is that because all of the wafers in a batch being transferred engage the comb or holder at substantially the same instant, the system is only fully compliant to the most seriously misaligned wafer. This means that either every wafer in the batch needs to be similarly misaligned for the compliant features to properly compensate for the misalignments, or that the system will not fully correct for the misalignments of some of the wafers. Yet another disadvantage of some existing compliant systems is that the degree of lateral compliance of the wafer comb or holder is a function of the payload, i.e., the number of wafers loaded into the comb. This means that the ability of the system to compensate for wafer misalignments depends upon the number of wafers in the comb. This produces a different degree of misalignment compensation for different wafers.

What is desired is an apparatus which can be used to transfer wafers between different wafer holding devices and which is tolerant of the many sources of alignment error. The apparatus should be capable of handling wafer misalignments with respect to multiple directions and compensating for those misalignments to restore the wafer to its correct position. The apparatus should also be capable of independently compensating for the misalignment of each wafer in a batch of wafers being transferred. These and other advantages of the present invention will be apparent to those skilled in the art upon a reading of the Detailed Description of the Invention together with the drawings.

SUMMARY OF THE INVENTION

The present invention is directed to an apparatus for use in transferring semiconductor wafers between wafer cassettes or other wafer holding devices. The wafers are subjected to a processing step while contained in a cassette or holder and are then transferred to the present invention, which takes the form of a compliant wafer comb, and transported to the location of the next processing step. The wafers are then transferred from the wafer comb to a cassette or wafer holder in which they will be processed further.

The compliant wafer comb includes a plurality of slots in which a wafer can be held while being transported. The slots are formed from V-shaped grooves and are parallel to each other. The grooves are of the same size, but are cut progressively deeper into the comb substrate as the grooves run from one end of the comb to the other. Thus, the bottoms of the grooves are offset from each other, with the level of the bottom of one groove being higher than that of the subsequent groove. This makes a line connecting the bottoms of the grooves inclined at a downward slope from one end of the comb to the other. This arrangement causes a single wafer at a time to become engaged with the comb when a batch of wafers is transferred from a cassette or other wafer holder to the comb, allowing the compliant features of the comb to compensate for the misalignment of each wafer individually.

The comb is coupled to a base structure by a set of independent column springs which permit motion of the comb slots in any direction necessary to compensate for a wafer's misalignment. This permits transfer of a misaligned wafer or wafers from a cassette or other holder to the comb without damaging the wafer(s).

Upon transfer of a wafer to the compliant comb, the spring suspension tends to restore the comb to its equilibrium position, placing the transferred wafer in approximately the correct alignment and preparing the comb for transfer of the next wafer. After transfer of all of the wafers into the comb, the comb containing the correctly aligned wafers is transported to a processing station. The wafers in the comb slots are then engaged with the slots of a cassette carrier or processing rack and transferred to the carrier or rack. The wafers are then processed, prior to be transferred back to the same or another comb and transported to the next processing station.

The present invention is also directed to a wafer handling system which includes the compliant comb and a sensor for monitoring when a wafer is severely enough misaligned that transfer to the comb would damage the wafer. In such a situation, a signal generated by the sensor is fed back to an attached controller and is used to alter the position of a robotic arm or other mechanism used to align the comb with respect to the wafers, or to halt the transfer.

Further objects and advantages of the present invention will become apparent from the following detailed description and accompanying drawings.

DETAILED DESCRIPTION OF THE INVENTION

The present invention is based on a compliant comb assembly which is used for transferring a single semiconductor wafer or batch of wafers from one processing station to another. The comb assembly includes a wafer comb having a plurality of slots, each capable of holding a wafer. The slots are of progressively increasing depth into a substrate, forming a downward sloping row of V-shaped indentations. The downward inclination of the bottoms of the grooves permits engagement of a single wafer at a time with the comb. This is in contrast to standard wafer combs in which the bottoms of the wafer slots are at the same level, causing the wafers in a batch to engage the comb at substantially the same moment.

The comb is coupled to a support base by a set of springs. The combination of downward sloping slots and spring suspension permits the present invention to compensate for multiple sources of wafer misalignment. These include fixed sources of wafer cassette or holder misalignment due to assembly errors or parts tolerances and variable sources of misalignment such as warping due to age or thermal expansion. Wafer dimension variations arising during the manufacturing process (thickness, diameter) or due to warping can also be accommodated and compensated for by the present invention.

The present invention can be used to assist with aligning robotic mechanisms used to transfer wafers, thereby reducing damage to the equipment. The compliant features of the comb assembly act to reduce the forces applied to the wafers during transfer from a cassette or other holder to the comb or from the comb to the cassette or holder. This results in less damage to the wafers and reduces incidents of wafer cross-slotting or placement into an incorrect slot of a cassette or holder.

There are two general modes of operation in which the compliant comb of the present invention is utilized: (1) insertion of one or more wafers into the comb; and (2) extraction of one or more wafers from the comb. The insertion or extraction of the wafers is typically initiated by engagement of the comb slots with wafers in the slots of a wafer cassette or other wafer holding device. In either case, each wafer to be transferred from the wafer holding device to the comb or from the comb to the holding device is in some state of misalignment with respect to the wafer slot in the comb.

The types of misalignments typically encountered include translational offsets as well as angular offsets. For example, the wafer positions(s) can be misaligned front-to-back, side-to-side, up-and-down, angularly with respect to a horizontal axis, and angularly with respect to a vertical axis relative to the comb slot(s).

Figure 1:
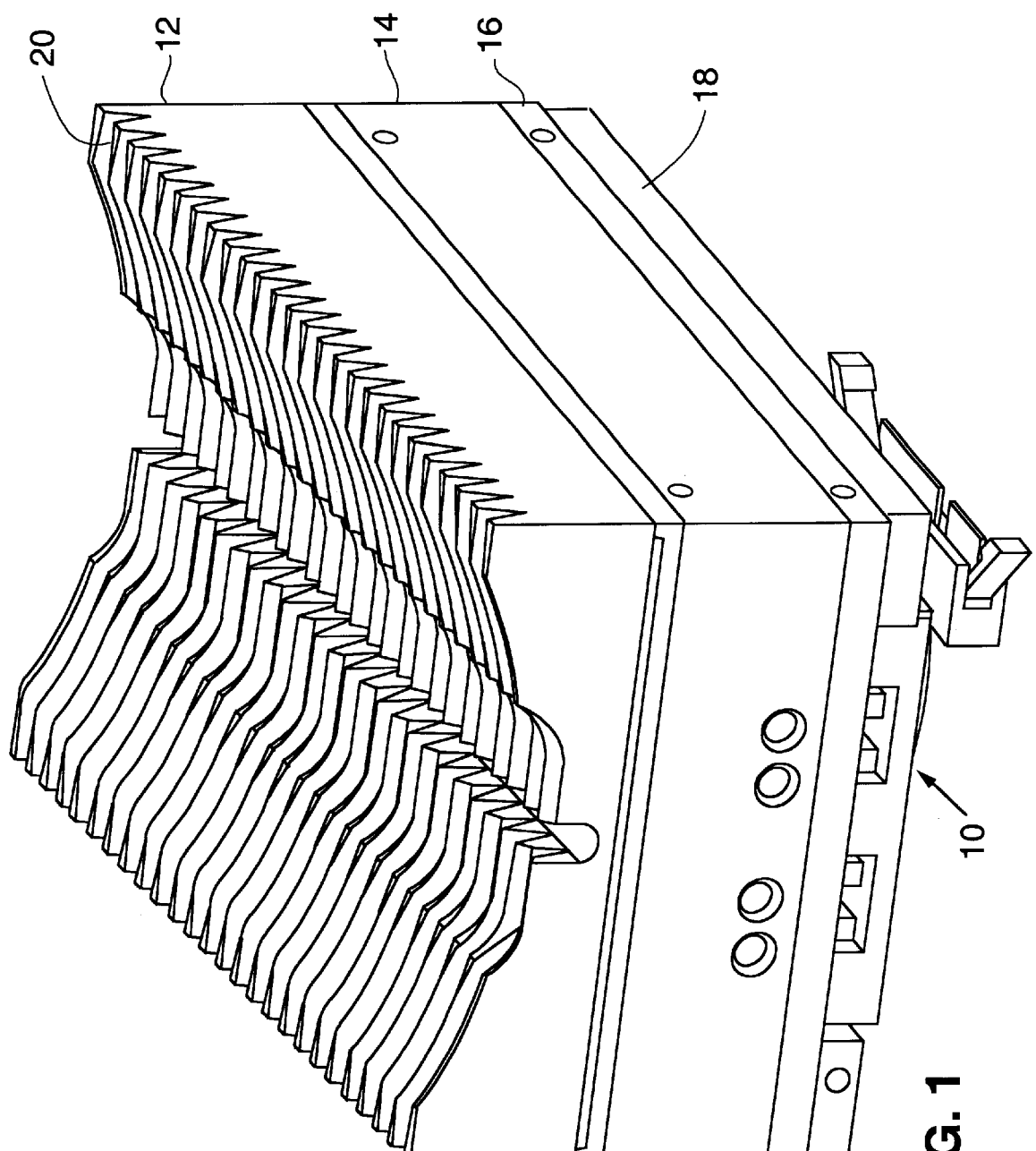
FIG. 1 is an oblique view of the compliant comb assembly which is part of the wafer handling system of the present invention.

FIG. 1 is an oblique view of compliant comb assembly 10 which is part of the wafer handling system of the present invention. Assembly 10 is composed of comb 12 which is statically coupled to comb base 14. The combination of comb 12 and comb base 14 are coupled to static mounting base 18 by the spring suspension system which will be described. When assembly 10 is used in conjunction with wafer position/motion detectors as part of a wafer handling system, assembly 10 also includes sensor sub-plate 16 in which the detectors are mounted. Static base 18 may be connected to a robotic arm or other device. As shown in FIG. 1, comb 12 includes a plurality of V-shaped grooves or slots 20 machined into a substrate. Each slot 20 is used to support a wafer placed in comb 12.

Figure 2A:
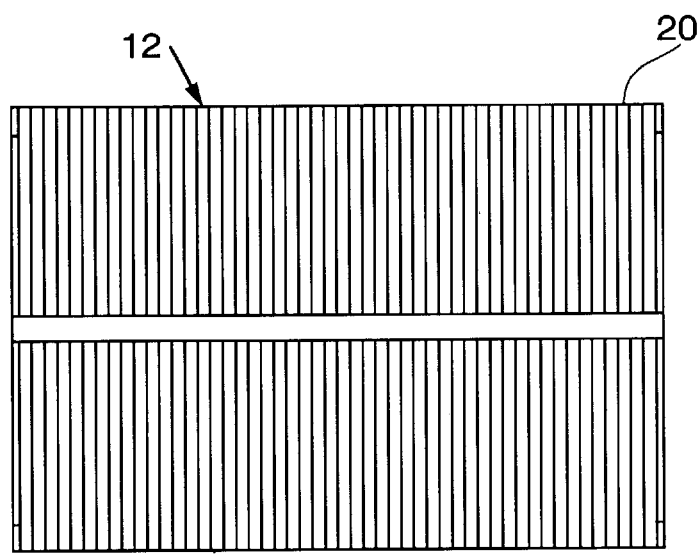
FIGS. 2A–2C are top, side, and end views of the wafer comb of FIG. 1, showing the downward sloping, V-shaped slots of the comb which are used to hold wafers.
Figure 2B:
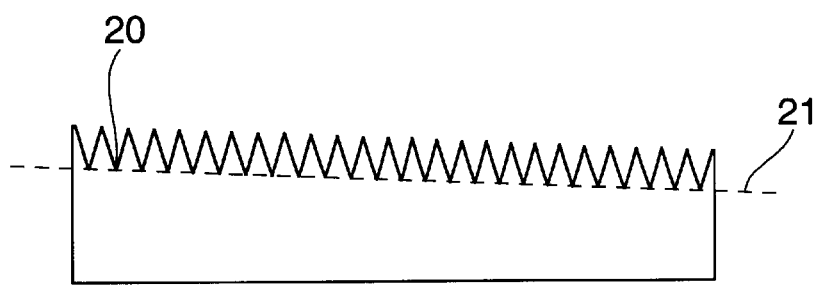
Figure 2C:
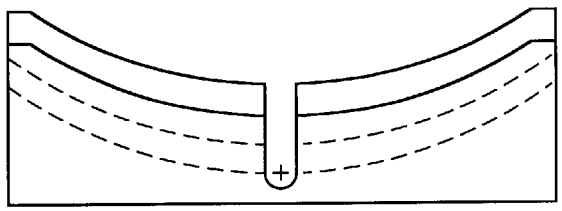

FIGS. 2A–2C are top, side, and end views of wafer comb 12 of FIG. 1, showing the downward sloping, V-shaped slots 20 of the comb which are used to hold wafers. As shown in FIG. 2(A), which is a top view of comb 12, a plurality of grooves or slots 20 are machined into the comb substrate. Each slot 20 is approximately V-shaped, with a size and spacing designed to hold a standard semiconductor wafer. As shown in FIG. 2(B), which is a side view of comb 12, although the size of each slot is the same, the bottom of the V-shaped slots are cut progressively deeper into the comb substrate as the slots run from one end of the comb to the other. The bottoms of the grooves are offset from each other, with the level of the bottom of one groove being higher than that of the subsequent groove. Thus, a line connecting the bottoms of the slots (as shown by line 21 in the figure) has a downward sloping orientation. This permits comb 12 to engage a single wafer at a time and comply to that wafer's misalignment prior to engaging the next wafer. This is in contrast to standard wafer combs in which the bottoms of the wafer slots are at the same level, causing the wafers in a batch to engage the comb at substantially the same moment. FIG. 2(C) shows an end view of comb 12. As shown, the slots in comb 12 are arc-shaped, with each slot supporting one wafer.

Compliance of the comb slots to lateral misalignments is achieved through corner-located column springs which provide for lateral and (limited) vertical mobility of the comb with respect to a static mounting plate. Mechanical stops are utilized to terminate exceedingly large motions and prevent damage to the springs and collisions between the comb and other items near its path.

During the process of inserting wafers into the comb, each wafer will contact the comb at some point within the V-shaped groove of one of the comb slots. The motion imparted due to the comb moving into a wafer or a waver moving into the comb is translated to lateral motion as the wafer engages the slot. The springs which form the suspension for the comb are designed to provide motion with the application of non-damaging force(s) to the wafer. The comb suspension permits the comb to rotate when the wafer is angularly misaligned.

Figure 3:
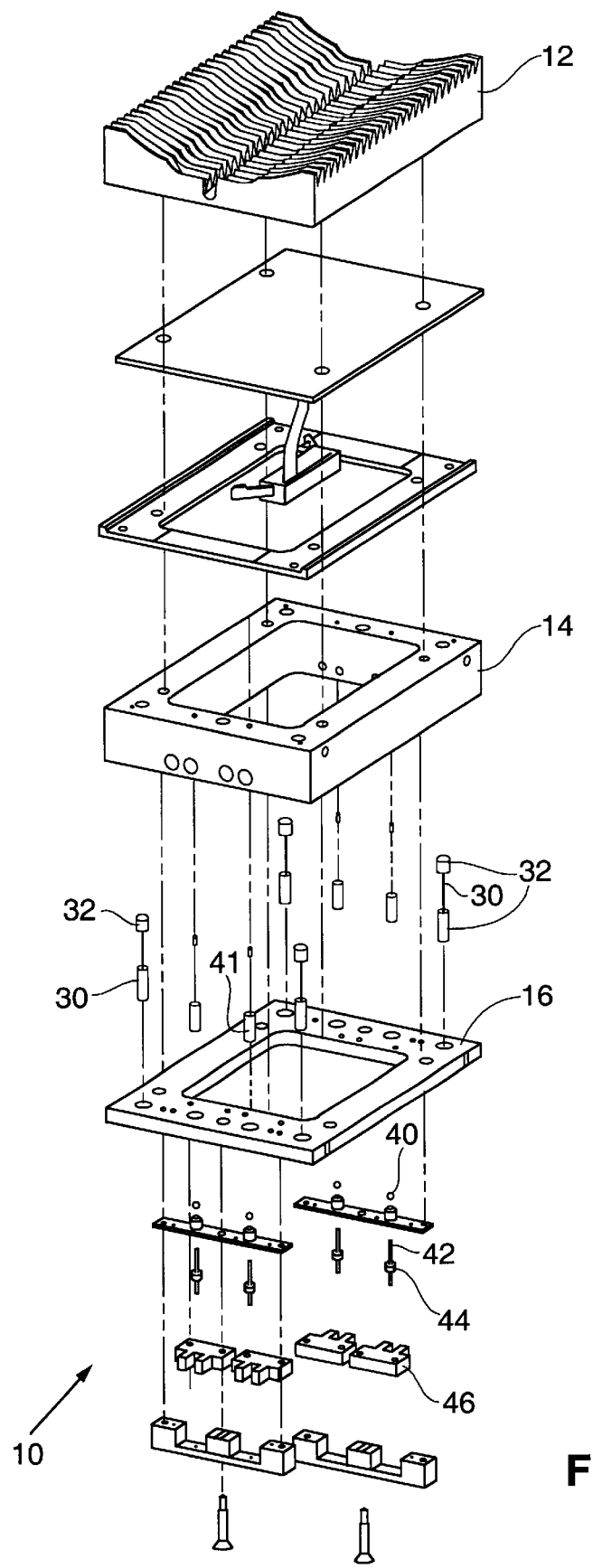
FIG. 3 is an exploded view of the compliant comb assembly of FIG. 1.

FIG. 3 is an exploded view of compliant comb assembly 10 assembly of FIG. 1. As shown in the figure, comb 12 is mounted to comb base 14. Comb base 14 is coupled to sensor sub-plate 16 (or other static mounting base) by a suspension formed from column spring assemblies located at the corners of plate 16. Each column spring assembly is formed from a spring 30 attached at each end to a plug 32. The plug at one end of the spring assembly is inserted into comb base 14, and the plug at the other end of the spring assembly is inserted into plate 16. This arrangement permits comb 12 and comb base 14 to be supported by a compliant suspension system over sensor plate 16. If position/motion sensors are not used to determine when a misalignment is too severe, then sensor plate 16 may be replaced by another type of static mounting base to which one of the spring end plugs 32 is inserted. In this case, comb 12 and comb base 14 would be supported by a compliant suspension system over the mounting base.

As noted, a position/motion detection system which incorporates the compliant comb structure may be constructed by including position/motion detection sensors in the comb structure. The combination of a compliant comb assembly having position sensors with a controller can be used to monitor the magnitude of wafer to transfer point misalignment, detect collisions, and as a robot position learning aid. The combination forms an effective wafer handling system for transferring wafers from one carrier to another.

The position/motion detection system is also very useful as a robot alignment and set-up aid. The comb can be slowly "driven" into the wafer carrier, for example, until the motion sensor is triggered. At that point, the robot, in conjunction with the robot controllers, can calculate its exact position, thus enabling the robot to "learn" the appropriate positions for wafer handling and transfer.

The comb position/motion detector shown in FIG. 3 operates by passing a flag 44 through a photogate sensor 46, causing a change of state of the sensor. Flag 44 is attached to a small rod 42 mounted on a linear bearing. Attached to the end of rod 42 is a ball 40 which rests in a female cone 41. Sensor 46, rod 42, and ball 40 are fixed to the stationary base of the comb assembly (sensor plate 16 or element 18 of FIG. 1) and the cone is fixed to the comb itself by means of the comb base, which is suspended on the compliant spring mechanism. The relative motion between the comb/cone and the ball/rod/flag assembly is detected by sensor 46. Flag 44 can be set on rod 42 so that it will trigger photogate sensor 46 after a specified amount of motion (deflection, rotation, etc.).

Figure 4:
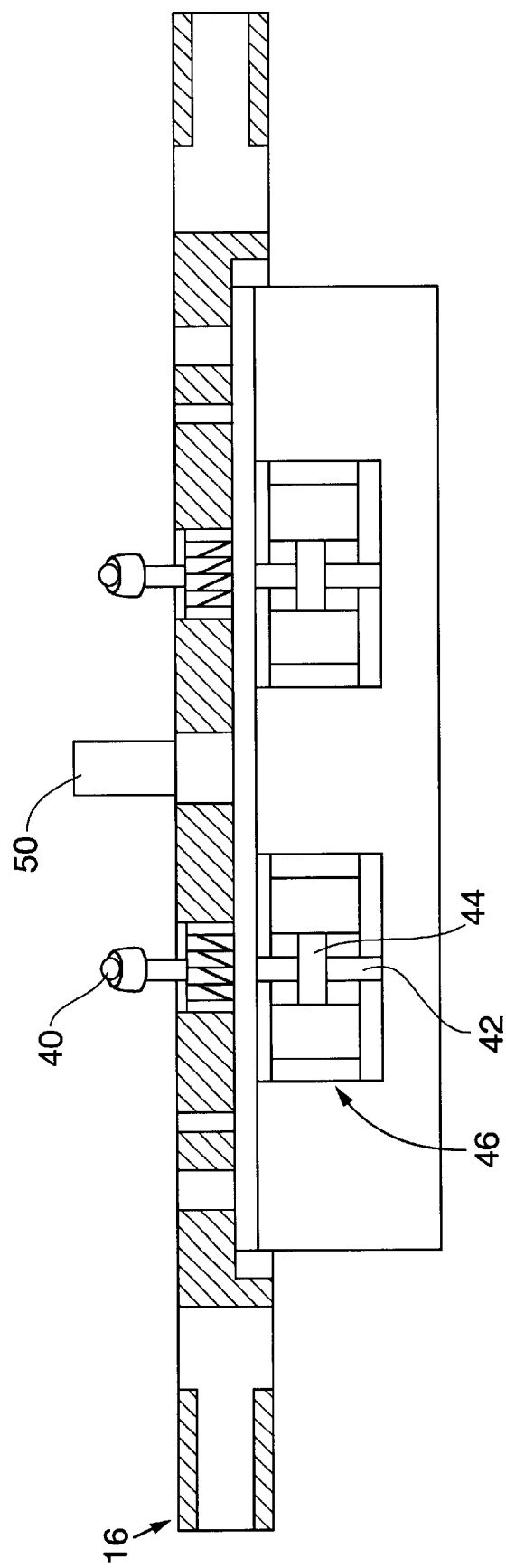
FIG. 4 is an end view of the sensor plate of FIGS. 1 and 3.

FIG. 4 is an end view of sensor plate 16 of FIGS. 1 and 3. As shown in the figure, the position/motion sensor is formed from flag 44 mounted on rod 42. Flag 44 triggers sensor 46 when it passes in front of the appropriate part of the sensor. Ball 40 mounted on the end of rod 42 fits into a cone (see FIG. 3) mounted on comb base 14. The movement of the comb relative to sensor plate 16 is then indicated by sensor 46. A hard stop 50 is used to limit the travel of the comb 12 and prevent damage to the components of the system.

The cone and ball assembly with sensor detects only the magnitude of a motion, not direction. The motion can also consist of a rotation of the comb relative to the comb base. Due to the fact that the axis of rotation can occur at any point, two sensors are required to accurately measure rotationally based deflections. For example, it is possible to have the comb rotate directly on axis with one of the sensors, thus showing no motion. By pairing the sensors at opposite ends of the comb, no lateral motion will go undetected.

In the detection of wafer to transfer point misalignment, flag 44 is set such that it will trigger sensor 46 at an acceptable maximum displacement. If this amount is exceeded, a robotic controller can be set up so that it will stop the motion of the robot, thus preventing damage to the wafers and/or the robot (a fuller explanation is presented later in conjunction with the description of FIG. 5).

In the present invention, four motion sensors are utilized, with the motion sensors arranged into two pairs. One pair is set so that it is triggered at a low level of deflection (approximately 0.015", as determined experimentally). The second pair is set so that it is triggered at a higher level of deflection (approximately 0.040", again as determined experimentally). The higher deflection limit is set to be approximately 0.010" before motion of the comb becomes limited by a hard stop. In practical use, the low level sensor trigger point can be used to provide a warning to the robot control system. If the low level sensor is regularly triggered during a certain point in the wafer transfer process, then there is a likelihood that some element of the transfer system is out of alignment or has a part having a dimension which exceeds the proper tolerances. The low level deflection limit is typically set so that it does not indicate an impediment to the wafer transfer process, but is useful as a diagnostic tool. The high level deflection limit is used to signify when the wafer transfer process should be halted to prevent damage to the robotics or the wafers.

The motion detection elements of the wafer handling system utilize photogate sensors which were selected due to their reliability, relatively high accuracy, and low hysteresis. Such sensors also provide a binary digital on/off signal that is well suited to processing by a controller. A more sophisticated sensor could also be used to detect a range of motion instead of a discrete point.

Comb 12 returns passively to its neutral position, corresponding to the correct alignment of the wafer in the slot after each transfer, due to the restoring force(s) of the spring suspension. The passive behavior provides tolerance to misalignment without impacting the wafer transfer throughput, as can occur when a control loop relying on sensors and movement of robotic elements is used.

In batch wafer transfers to or from a comb in which multiple wafers contact the comb at the same moment, a potential for binding exists when the relative misalignments of different wafers interfere. This situation arises when one wafer requires the comb to adjust to its misalignment by moving in one direction, while another wafer requires the comb to move in the opposite direction. The net effect is little or no compliance of the comb slots to the misalignments and the development of potentially damaging forces. To mitigate this effect, as noted, the V-shaped slots of the compliant comb of the present invention are arranged so that the bottoms of the slots form a downward sloping line. This feature allows the wafers to contact or be removed from the comb essentially one at a time, with the comb being able to "comply" to wafer misalignments individually. This prevents the binding problems associated with multiple wafer misalignment.

In the event of a vertical collision between a wafer and the comb or a vertical misalignment, the comb will deflect vertically to prevent damage to wafers and/or the comb itself. The amount of deflection depends upon the force required to induce beam-column buckling of the column springs which form the suspension. Skilled individuals will note that the vertical compliance of the comb slots to wafers can be achieved through non-buckling means. For example, a coil spring may be used which provides both vertical and lateral compliance.

Due to the relative offset between wafer(s) and the comb and that the comb is lightly coupled to a static plate, it is prone to oscillations when perturbed. This means that the comb can be set into undesirable oscillations in the absence of a sufficient damping mechanism. The unwanted oscillatory motions can be damped out by placing a material such as a low stiffness sponge rubber between comb base 14 and plate 16. If the present invention is used as part of a wafer transfer system having motion sensors to detect the position of the comb and wafers, the sliding friction in the motion detect mechanism (e.g., the rod, flag, and ball assembly) can be made sufficient to provide the desired degree of damping and gently restore the comb to its neutral, undeflected position.

The compliant comb assembly can be attached to a moving frame or ground frame of reference. The wafers can be inserted into or extracted from the comb by another device, or the comb itself may be moved to positions to receive or transfer the wafers to suitable fixtures or robotic effectors.

As noted, compliance of the comb assembly to misalignments of a wafer relative to a comb slot is obtained using column springs (elements 30 and 32 of FIG. 3) which are formed from thin wire (typically 0.020" in diameter) fixed at each end to a 0.25" diameter aluminum plug. Aluminum plugs 32 on one end of each spring 30 are attached to the comb and the aluminum plugs at the other end of each spring are attached to a static plate, e.g., base 18 of FIG. 1 or sensor plate 16.

The spring length and diameter are designed so as to have a desired stiffness and acceptable displacement, while not exceeding a specified endurance limit in the steel wire from which the springs are made. This effectively provides an infinite life to the springs. Motion limiting stops are used to limit travel of the comb to a practical maximum value. A value of 0.050" was found by the inventors to be practical for the environment in which the compliant comb was designed to be used.

The compliant comb assembly of the present invention may be constructed to have only a significant lateral compliance, or both lateral and vertical compliance. The primary feature which is modified to achieve the desired compliance is the design of the springs which support the comb above the base plate. If the springs have a high degree of flexibility in both lateral and vertical directions, then both lateral and vertical compliance is obtained. If the springs only have a high degree of flexibility in the lateral direction (such as the column springs previously described), then the suspension is relatively stiff in the vertical direction and compliance will be primarily in the lateral direction. In such a case, if there is a vertically directed collision with the comb structure, the comb will hit the comb base plate after deflecting only a small amount (e.g., a few thousandths of an inch). Thus, by varying the design of the spring suspension, a desired range of lateral and/or vertical motion of the comb can be achieved. The lateral motion can be decoupled from vertical motions, or can be coupled to it through spring designs which transfer a portion of a laterally directed impulse to the vertical direction (or vice-versa).

In the present invention, the V-shaped grooves or slots in the wafer comb have a spacing of 0.250". This was chosen because it is the industry standard for 8" diameter wafers. Other slot spacings could be employed depending upon the wafer sizes and thicknesses. As noted, the slots used to hold the wafers are in the shape of a sharp bottom V-shaped groove, with sides inclined at approximately 30 degrees. Successive slots have a change in height between them of approximately 0.010". This forms a "stair-step" design which causes the wafers to be arranged in a downward slope when placed in the slots. The downward sloping causes the wafers to be lifted one at a time from slots in a wafer cassette or wafer holding device when the wafers in the cassette or device are engaged with the comb slots. The individual lifting of the wafers out of a cassette or holding device allows the compliant features of the comb to adjust to misalignment problems for each individual wafer. It also diminishes any wafer binding problems which might arise from discrepancies between the spacing of the slots in the wafer cassette or comb. Such discrepancies can arise from manufacturing errors, thermally induced expansion/ contraction of the slot spacing, or warping due to age or other factors.

Figure 5:
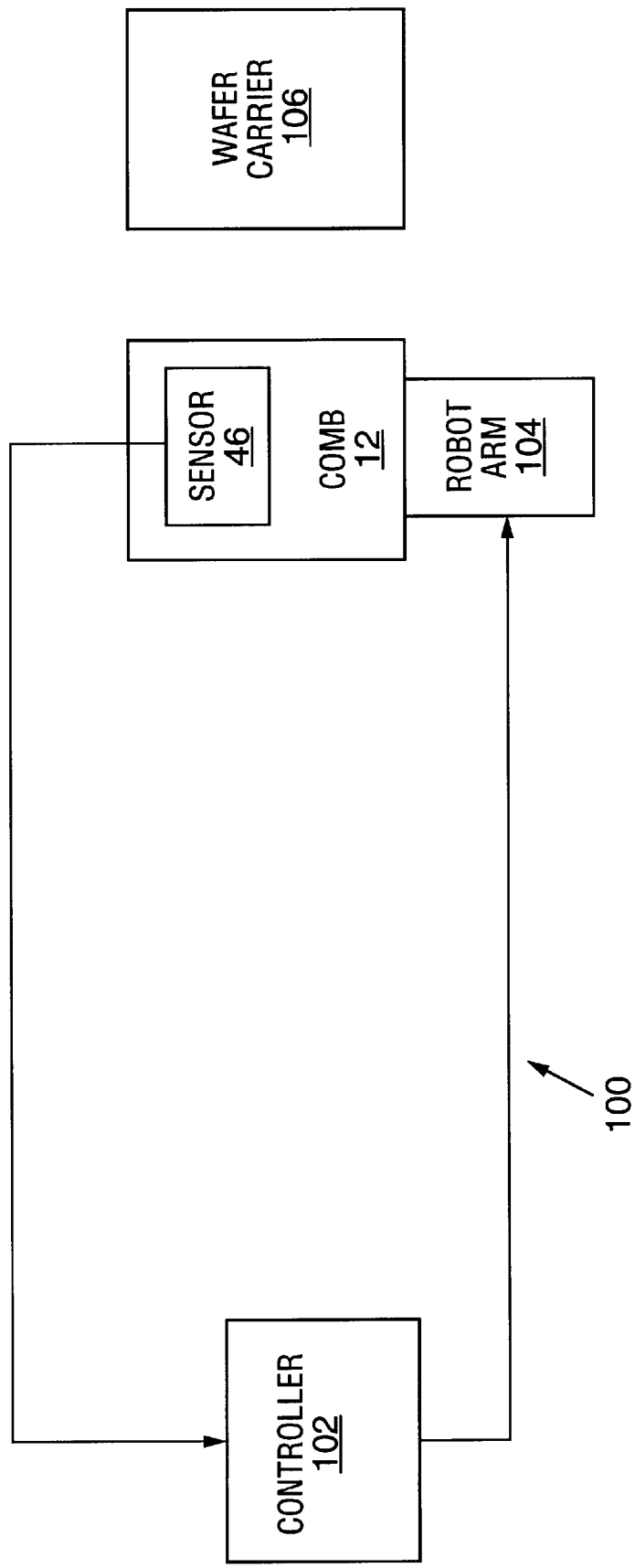
FIG. 5 is a block diagram of the wafer handling system of the present invention which includes the compliant comb assembly of FIG. 1.

FIG. 5 is a block diagram of the wafer handling system of the present invention 100 which includes the compliant comb assembly of FIG. 1. As shown in the figure, system 100 includes a robotic arm 104 or other transport device on which comb assembly 10 of FIG. 1 is mounted, where assembly 10 is represented by comb 12 and sensor 46 in the figure. Typically, comb 12 is being used to transfer wafers to a wafer carrier 106 or other wafer holding device, or to extract them from carrier 106. A signal generated by sensor 46 when the displacement of the comb relative to a static base exceeds a desired amount is input to controller 102, which responds by generating control signals used to stop the motion of or alter the position of robot arm 104.

The present invention provides a compliant wafer handling system which includes a wafer comb suspended above a static base. The suspension is in the form of springs which provide lateral and if desired, vertical compliance to misaligned wafers. A plurality of downward sloping V-shaped grooves hold the wafers in the comb and permit the comb to engage a single wafer at a time. This allows the suspension system to accommodate to, and compensate for, each individual wafer's misalignment as the wafer is loaded into or extracted from the comb. The combination of suspension and sloped grooves allows the wafer handling system to be used with a range of wafer carriers and to accommodate variations in the size and fit of the wafers and wafer carriers. The suspension system is designed so that the spring force applied to the comb is substantially independent of the comb payload. This means that to first order, the lateral compliance of the comb to misalignments is not a function of the number of wafers in the comb.

The compliant features of the comb act to reduce the forces imparted to wafers as they are loaded into or extracted from the comb, thereby reducing damage to the wafers. The compliant features of the present invention are in contrast to practices in the semiconductor industry, where precise positioning and small tolerances are demanded, and control of robotic mechanisms is typically used to compensate for misalignments.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. An apparatus for transporting semiconductor wafers, comprising:

a wafer comb having a first indentation proportioned for holding a first semiconductor wafer, a second indentation proportioned for holding a second semiconductor wafer, and a third indentation proportioned for holding a third semiconductor wafer, each indentation having a bottom, wherein the bottom of the second indentation is offset from the bottom of the first indentation, and the bottom of the third indentation is offset from the bottoms of the first and second indentations, the first, second and third indentations arranged for simultaneously supporting wafers in an upright position in each of the first, second and third indentations at different levels; and a plate resiliently coupled to the wafer.

2. The apparatus of claim 1, wherein the first and second indentations are V-shaped.

3. The apparatus of claim 1, wherein the wafer comb and plate are coupled by a suspension system which includes a plurality of springs, each spring being connected at a first end to the wafer comb and at a second end to the plate.

4. The apparatus of claim 1, further comprising:

a sensor which outputs a control signal when a motion of the wafer comb relative to the plate exceeds a predetermined amount.

5. The apparatus of claim 4 wherein the wafer comb includes a plurality of indentations in a linear arrangement, the indentations formed to progressively increasing depths from one end of the linear arrangement to the other end of the linear arrangement.

6. The apparatus of claim 1 wherein the wafer comb includes a plurality of indentations in a linear arrangement, the indentations formed to progressively increasing depths from one end of the linear arrangement to the other end of the linear arrangement.

7. A wafer handling system, comprising:

a compliant wafer comb including a wafer comb having a first indentation proportioned for holding a first semiconductor wafer, a second indentation proportioned for holding a second semiconductor wafer, and a third indentation proportioned for holding a third semiconductor wafer, each indentation having a bottom, wherein the bottom of the second indentation is offset from the bottom of the first indentation and the bottom of the first indentation is offset from the bottoms of the first and second indentations, the first, second and third indentations arranged for simultaneously supporting wafers in an upright position in each of the indentations at different levels, and a plate resiliently coupled to the wafer comb a sensor which outputs a sensor control signal when a motion of the wafer comb relative to the plate exceeds a predetermined amount;

a robotic member on which the compliant comb is mounted; and a controller having the sensor control signal as an input and which responds to the sensor control signal by outputting a control signal for the robotic member.

8. The wafer handling system of claim 7, wherein the first and second indentations are V-shaped.

9. The wafer handling system of claim 7, wherein the wafer comb and plate are coupled by a suspension system which includes a plurality of springs, each spring being connected at a first end to the wafer comb and at a second end to the plate.

10. A compliant wafer holder including:

a plate; and a wafer comb resiliently mounted onto the plate, the wafer comb including at least three wafer-receiving slots in a linear arrangement, each of the slots proportioned to receive a semiconductor wafer in an upright position, wherein the slots are formed to progressively increasing proportions from one end of the linear arrangement to the other end of the linear arrangement and are arranged for supporting wafers in each of the three slots at different levels.

11. The compliant wafer holder of claim 10, wherein the wafer comb and plate are coupled by a suspension system which includes a plurality of springs, each spring being connected at a first end to the wafer comb and at a second end to the plate, the springs arranged to permit deflection of the wafer comb relative to the plate in response to misalignment of a wafer being moved into one of the wafer-receiving slots.

12. The apparatus of claim 10 further including:

a sensor which outputs a sensor control signal when a motion of the wafer comb relative to the plate exceeds a predetermined amount;

a robot member on which the plate is mounted; and a controller coupled to deliver control signals to the robotic member, the controller responsive to the sensor control signal.

* * * * *